(12) United States Patent
Hong

(10) Patent No.: US 7,968,366 B2
(45) Date of Patent: Jun. 28, 2011

(54) IMAGE SENSOR AND METHOD FOR MANUFACTURING THE SAME

(75) Inventor: Ji Ho Hong, Hwaseong-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 493 days.

(21) Appl. No.: 12/049,693

(22) Filed: Mar. 17, 2008

(65) Prior Publication Data

US 2008/0230865 A1    Sep. 25, 2008

(30) Foreign Application Priority Data

Mar. 19, 2007   (KR) ................. 10-2007-0026730

(51) Int. Cl.
*H01L 21/00*   (2006.01)

(52) U.S. Cl. ............. 438/67; 438/70; 438/75; 257/443; 257/E27.134

(58) Field of Classification Search ................. 257/291, 257/292, 294, E27.133, E27.134, 443; 438/66, 438/67, 70, 75
See application file for complete search history.

(56) References Cited

U.S. PATENT DOCUMENTS

| 6,215,164 B1 | 4/2001 | Cao et al. | |
| 6,759,262 B2 * | 7/2004 | Theil et al. | 438/48 |
| 6,841,411 B1 * | 1/2005 | Varghese | 438/94 |

* cited by examiner

*Primary Examiner* — Minh-Loan T Tran
(74) *Attorney, Agent, or Firm* — Saliwanchik, Lloyd & Eisenschenk

(57) ABSTRACT

An image sensor and method of manufacturing the same are provided. According to an embodiment, the image sensor comprises: a circuit including an interconnection on a substrate; a lower electrode on the interconnection; a separated intrinsic layer on the lower electrode; a second conductive type conduction layer on the separated intrinsic layer; and an upper electrode on the second conductive type conduction layer. The separated intrinsic layer can have an inwardly sloping sidewall to focus light incident the photodiode for the unit pixel.

11 Claims, 4 Drawing Sheets

IMAGE SENSOR AND METHOD FOR MANUFACTURING THE SAME

CROSS-REFERENCE TO RELATED APPLICATION

The present application claims the benefit under 35 U.S.C. §119 of Korean Patent Application No. 10-2007-0026730, filed Mar. 19, 2007, which is hereby incorporated by reference in its entirety.

BACKGROUND

In general, an image sensor is a semiconductor device for converting an optical image into an electrical signal, and is roughly classified as a charge coupled device (CCD) image sensor or a complementary metal oxide semiconductor (CMOS) image sensor (CIS).

A CIS includes a photodiode and a metal oxide semiconductor (MOS) transistor in each unit pixel. To operate, the CIS sequentially detects electrical signals of the respective unit pixels in a switching mode, thereby realizing an image.

The related CIS includes a photodiode region that receives an optical signal to convert it into an electrical signal, and a transistor region that processes the electrical signal.

This related CIS has a structure in which the photodiode and the transistor are horizontally disposed.

Although the related CIS overcomes drawbacks of the CCD image sensor, the related CIS still has problems to be solved.

Specifically, according to the related CIS having the horizontal structure, the photodiode and the transistor are formed horizontally adjacent to each other on the substrate. Thus, the CIS requires an additional region for the photodiode on the substrate. Thereby, the CIS decreases a region corresponding to a fill factor, and restricts a possibility to increase resolution thereof.

Further, according to the related CIS having the horizontal structure, it is very difficult to optimize a process of simultaneously forming the photodiode and the transistor. In other words, the process of forming the transistor requires a shallow junction for low sheet resistance, but such a shallow junction is not suitable for the process of forming the photodiode.

Usually the related CIS having the horizontal structure additionally provides on-chip functions. Thus, a size of the unit pixel should be increased in order to maintain sensitivity of the CIS, or an area for the photodiode should be decreased in order to maintain a pixel size. However, if the pixel size is increased, the resolution of the CIS is decreased. Furthermore, if the area for the photodiode is decreased, the sensitivity of the CIS is decreased.

BRIEF SUMMARY

Accordingly, embodiments provide an image sensor and a method for manufacturing the same capable of providing a vertical integration of transistor circuitry and photodiodes.

Certain embodiments provide an image sensor and the method for manufacturing the same capable of improving resolution together with sensitivity.

An image sensor and method for manufacturing the same according to embodiments of the present invention are capable of employing a vertical photodiode and inhibiting crosstalk between unit pixels.

An image sensor according to an embodiment of the present invention comprises: a circuit including an interconnection on a substrate; a lower electrode on the interconnection; a separated intrinsic layer on the lower electrode; a second conductive type conduction layer on the intrinsic layer; and an upper electrode on the second conductive type conduction layer.

A method for manufacturing an image sensor according to an embodiment of the present invention comprises: forming a circuit including an interconnection on a substrate; forming a lower electrode on the interconnection; forming separated intrinsic layers on the substrate including the lower electrode; forming a second conductive type conduction layer on the separated intrinsic layers; and forming an upper electrode on the second conductive type conduction layer.

DETAILED DESCRIPTION

Hereinafter, an image sensor and a method for manufacturing the same according to embodiments of the present invention will be described in detail with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
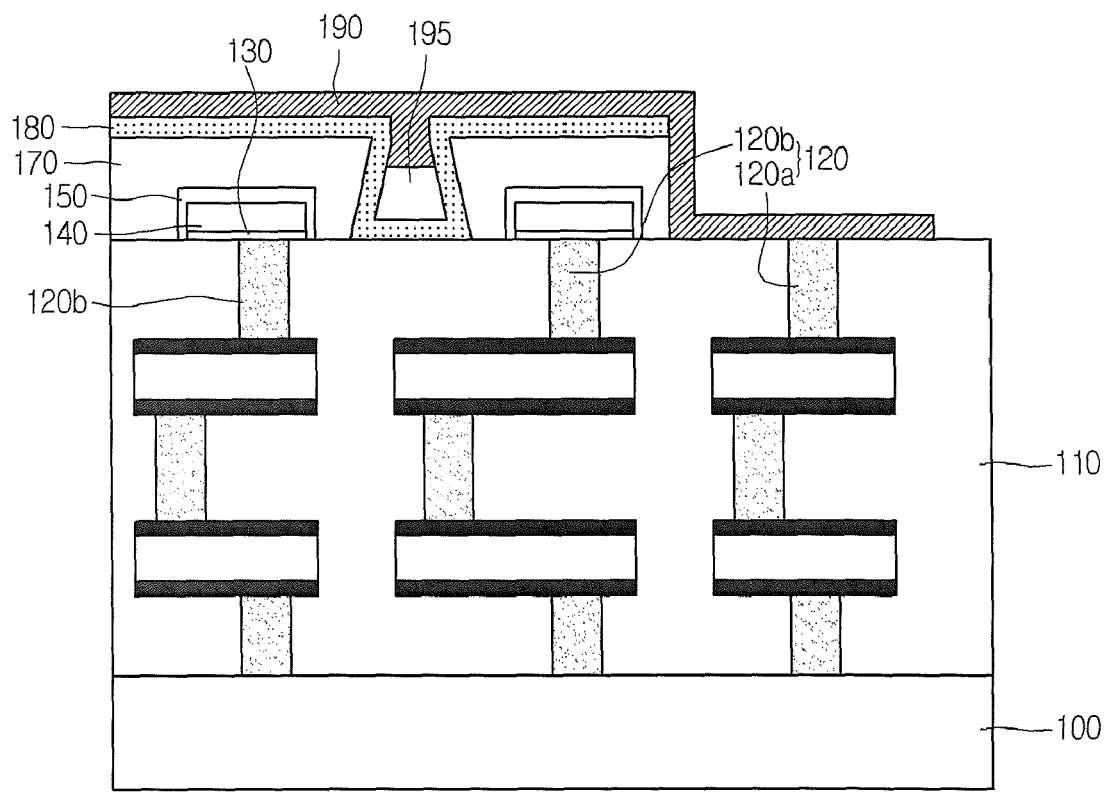
FIG. 1 is a cross-sectional view of an image sensor according to an embodiment of the present invention.

FIG. 1 is a cross-sectional view of an image sensor according to an embodiment of the present invention.

Referring to FIG. 1, in an image sensor according to an embodiment of the present invention, it should be noted that the photodiodes, which are formed above the substrate and receive an incident light from the outside to convert and maintain the light into an electrical form, can be PIN diodes.

A PIN diode can be provided as a structure where an n-type amorphous silicon, an intrinsic amorphous silicon, and a p-type amorphous silicon are bonded. The performance of a photodiode is determined depending on the efficiency of receiving light from the outside and converting it into an electrical form, and the total charge capacitance. The related art photodiode formed in a substrate generates and stores charge at a depletion region generated in a hetero-junction (for example, P-N, N-P, P-N-P, or N-P-N).

However, the PIN diode is advantageous in generating and storing the charge, since the entire intrinsic amorphous silicon layer formed between the p-type silicon layer and the n-type silicon layer becomes the depletion region.

When a PIN diode is used as the photodiode of embodiments of the present invention, the structure of the PIN diode can be the structure of a P-I-N or an N-I-P. In the described embodiments, the PIN diode having the P-I-N structure is used by way of an example, and the n-type amorphous silicon is referred to as the first conductive type conduction layer 150, the intrinsic amorphous silicon is referred to as the intrinsic layer 170, and the p-type amorphous silicon is referred to as the second conductive type conduction layer 180. However, embodiments are not limited thereto.

In other embodiments, a PIM diode can be used. A PIM diode differs from a PIN diode by utilizing a metal layer ("M") instead of an n-type conductive layer ("N"). The metal layer can be any metal that is capable of being silicided at a low temperature, such as a temperature of less than 300° C. For example, the metal layer can be formed of Cr, Mo, or W. In embodiments adopting the PIM structure, the lower electrode 140 can be used as the "M" layer of the PIM diode and no n-type conductive layer is provided.

An image sensor according to an embodiment of the present invention can include a circuit including an interconnection 120 on a substrate 100; a lower electrode 140 on the interconnection 120; a separated intrinsic layer 170 on the lower electrode 140; a second conductive type conduction layer 180 on the intrinsic layer 170; and an upper electrode 190 on the second conductive type conduction layer 180. Although the Figures show two metal layers on the substrate (in the interlayer dielectric layer 110), embodiments should not be limited thereto.

The intrinsic layer 170 can be used to focus light toward the lower electrode of each unit pixel by having a sloping sidewall. For example, the intrinsic layer 170 can focus light incident the photodiode by having inwardly sloping sides. According to an embodiment, the sloping sides can provide a separation between adjacent pixels having longer bottom edge spacing than upper edge spacing.

Also, cross-talk can be inhibited by a void 195 formed between the second conductive type conduction layer 180 and the upper electrode 190 within the separation between separated intrinsic layers 170. Accordingly, the void 195 can be formed between pixel boundaries.

In a further embodiment, a barrier metal 130 can be formed on the interconnection 120. The barrier metal 130 can be, for example, W, W-nitride, Ti, Ti-nitride, Ta or Ta-nitride.

In embodiments utilizing a P-I-N or N-I-P structure, a first conductive type conduction layer 150 can be formed between the lower electrode 140 and the intrinsic layer 170.

In the image sensor according to embodiments of the present invention, the transistor circuitry and the photodiodes are vertically integrated. Therefore, the image sensor can have a fill factor approaching 100%. In addition, embodiments can provide sensitivity higher than that of the related horizontally structured image sensor for the same pixel size.

Further, in comparison with the related image sensor, the image sensor according to embodiments of the present invention can further reduce process cost for the same resolution, and realize more complicated transistor circuitry in each unit pixel without reduction of the sensitivity.

In an image sensor according to embodiments of the present invention, additional on-chip circuitry can be integrated to increase performance of the image sensor, and obtain miniaturization of the device as well as reduction of production cost.

Also, an image sensor according to embodiments of the present invention is capable of employing a vertical photodiode and can inhibit crosstalk by providing isolation between pixels.

Hereinafter, a method for manufacturing an image sensor according to an embodiment of the present invention will be described in detail with reference to the accompanying drawings.

FIGS. 2 to 7 are cross-sectional views for describing a manufacturing process of an image sensor according to an embodiment of the present invention.

Figure 2:
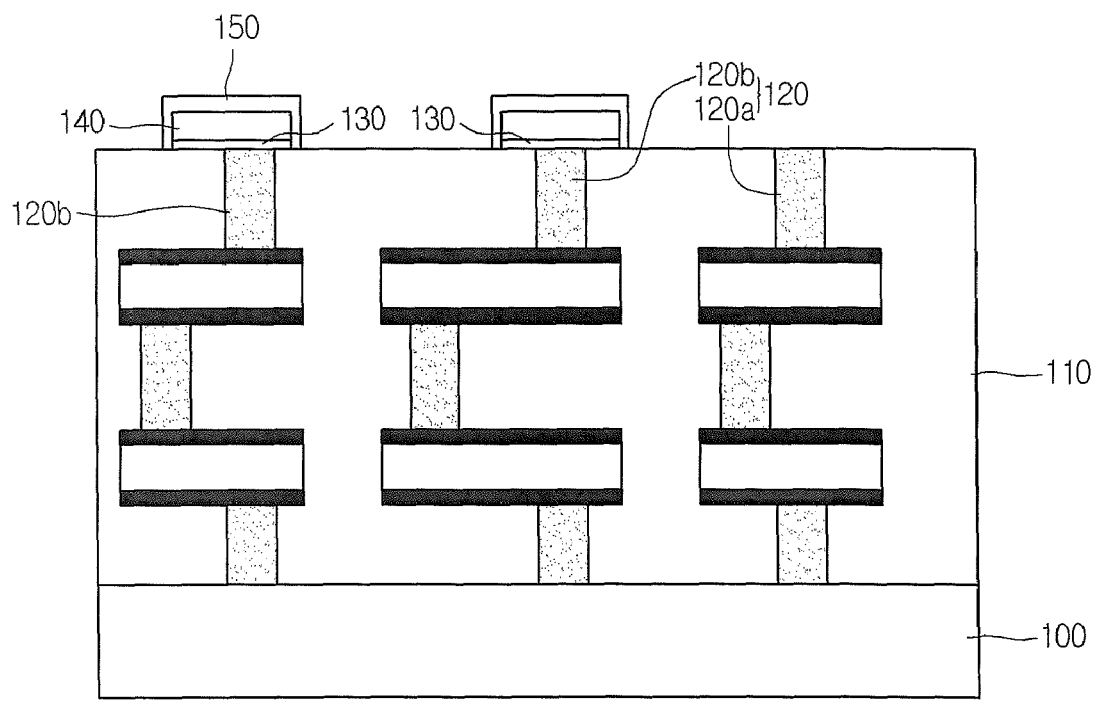
FIGS. 2 to 7 are cross-sectional views of a manufacturing process of an image sensor according to an embodiment of the present invention.

Referring to FIG. 2, a circuit including interconnections 120 formed in an interlayer dielectric layer (ILD) 110 can be formed on a substrate 100.

The interconnections 120 can include a metal line and a plug. The plug can include a first plug 120a and a second plug 120b.

In one embodiment, a barrier metal 130 can be formed on the interconnections 120. The barrier metal 130 can include, for example, W, W-nitride, Ti, Ti-nitride, Ta, or Ta-nitride. In some embodiments, the barrier metal 130 can be omitted.

Next, a lower electrode 140 can be formed on the interconnection 120. The lower electrode 140 can be formed of a conductive material including metal, alloy or silicide. For example, the lower electrode 140 can be formed of Al, Cu or Co.

The lower electrode 140 can be patterned to each pixel. In some embodiments also including a first conductive type conduction layer 150, the lower electrode 140 can be patterned after forming the first conductive type conduction layer 150 on the material for the lower electrode 140.

According to an embodiment, a first conductive type conduction layer 150 can be formed on the patterned lower electrode 140. In some embodiments, the first conductive type conduction layer 150 can be omitted.

The first conductive type conduction layer 150 can serve as the "N-type" layer of a PIN diode. In other words, the first conductive type conduction layer 150 can include, but is not limited to, an N-type conductive type conductive layer.

The first conductive type conduction layer 150 can be formed of, but is not limited to, n-doped amorphous silicon. For example, the first conductive type conduction layer 150 can be formed of amorphous silicon with Ge, C, $N_2$, or $O_2$ added, such as a-Si:H, a-SiGe:H, a-SiC, a-SiN:H, a-SiO:H, or the like.

In an embodiment, the first conductive type conduction layer 150 can be formed by a chemical vapor deposition (CVD) such as plasma enhanced CVD (PECVD). For example, the first conductive type conduction layer 150 can be formed of amorphous silicon through PECVD by using a mixture gas obtained by mixing PH3 or P2H5 with silane (SiH4) gas.

According to embodiments of the present invention, crosstalk can be inhibited by using a patterned first conductive type conduction layer 150.

Next, forming a separated intrinsic layer 170 according to an embodiment is described as follows.

Figure 3:
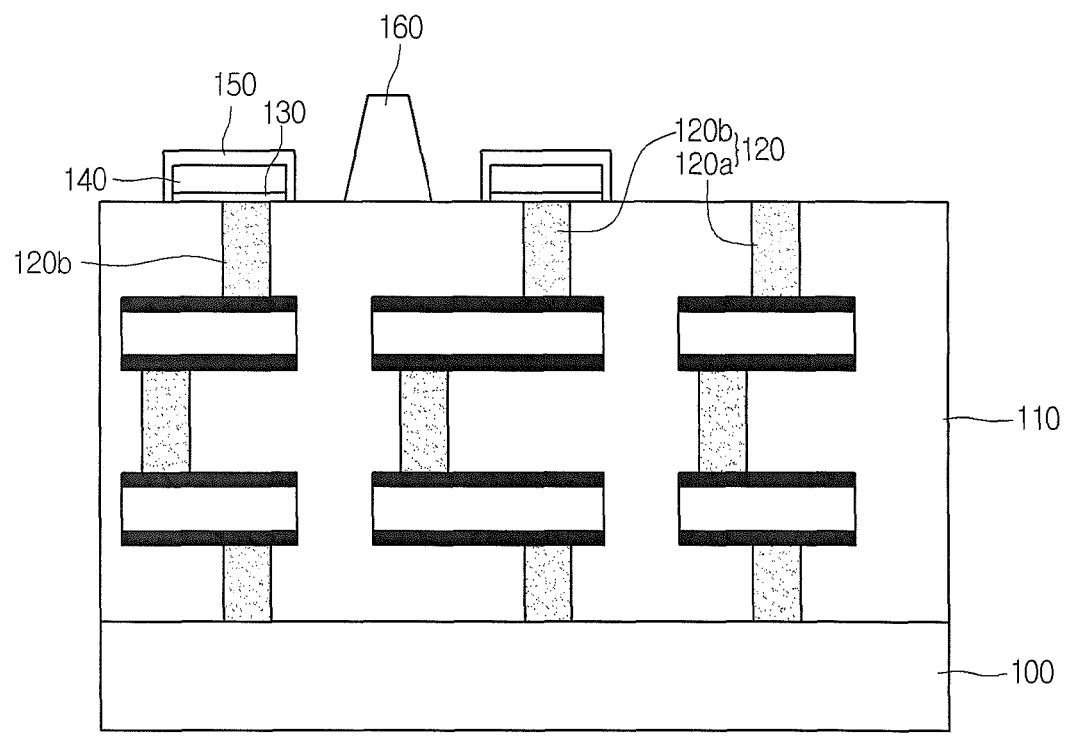

Referring to FIG. 3, an isolating layer pattern 160 can be formed between unit pixels on the substrate.

The isolating layer pattern 160 can include a slope on its sidewall in order to form an intrinsic layer 170 having sloping sidewalls. The sloping sidewalls of the intrinsic layer 170 can enable improved light focusing towards a pixel's lower electrode 140.

For example, the isolating layer pattern 160, which has a longer bottom surface than upper surface, can make the intrinsic layer 170 formed on the isolating layer pattern 160 have a slope. Therefore, the intrinsic layer 170 can focus light incident to the photodiode by having sloping sides that narrow inward for each unit pixel.

Also, the isolating layer pattern 160 can be made of material which has a high etching selectivity compared to the intrinsic layer 170. For example, the isolating layer pattern 160 can be formed of a photoresist. According to such an embodiment, the isolating layer pattern 160 can be made to have a longer bottom line than an upper line by setting the photo condition plus (+) defocus during photoresist patterning.

Figure 4:
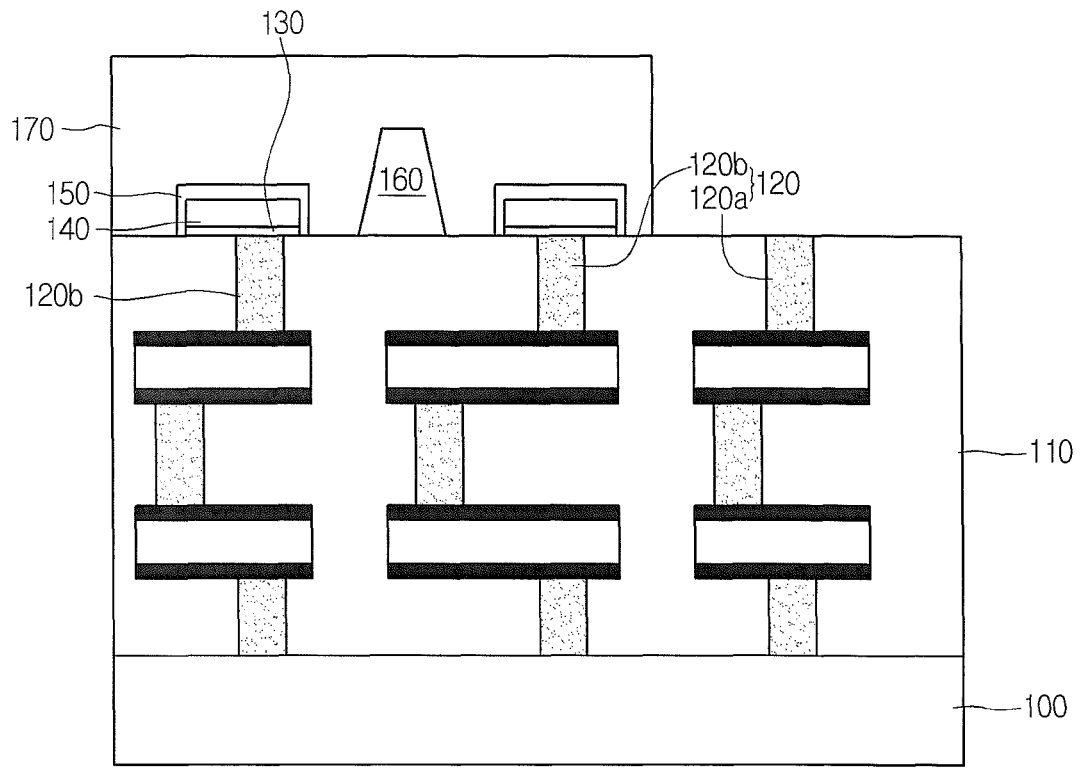

Referring to FIG. 4, an intrinsic layer 170 can be formed on the isolating layer pattern 160. After forming the intrinsic layer 170, a selective etching of the intrinsic layer 170 using a mask pattern (not shown) can be performed to expose the first plug 120a, which is to be connected to an upper electrode (see reference 190 of FIG. 1).

In some embodiments, the selective etching of the intrinsic layer 170 can be performed after forming the second conductive type conduction layer 180. In such embodiments, both the second conductive type conduction layer 180 and the intrinsic layers can be selectively etched to expose the first plug 120a.

The intrinsic layer 170 can serve as an "I-type" layer of a PIN diode. In an embodiment, the intrinsic layer 170 can be formed of non-doped amorphous silicon. The intrinsic layer 170 can be formed by CVD, such as PECVD. For example, the intrinsic layer 170 can be formed of amorphous silicon using silane (SiH4) gas by PECVD.

Figure 5:
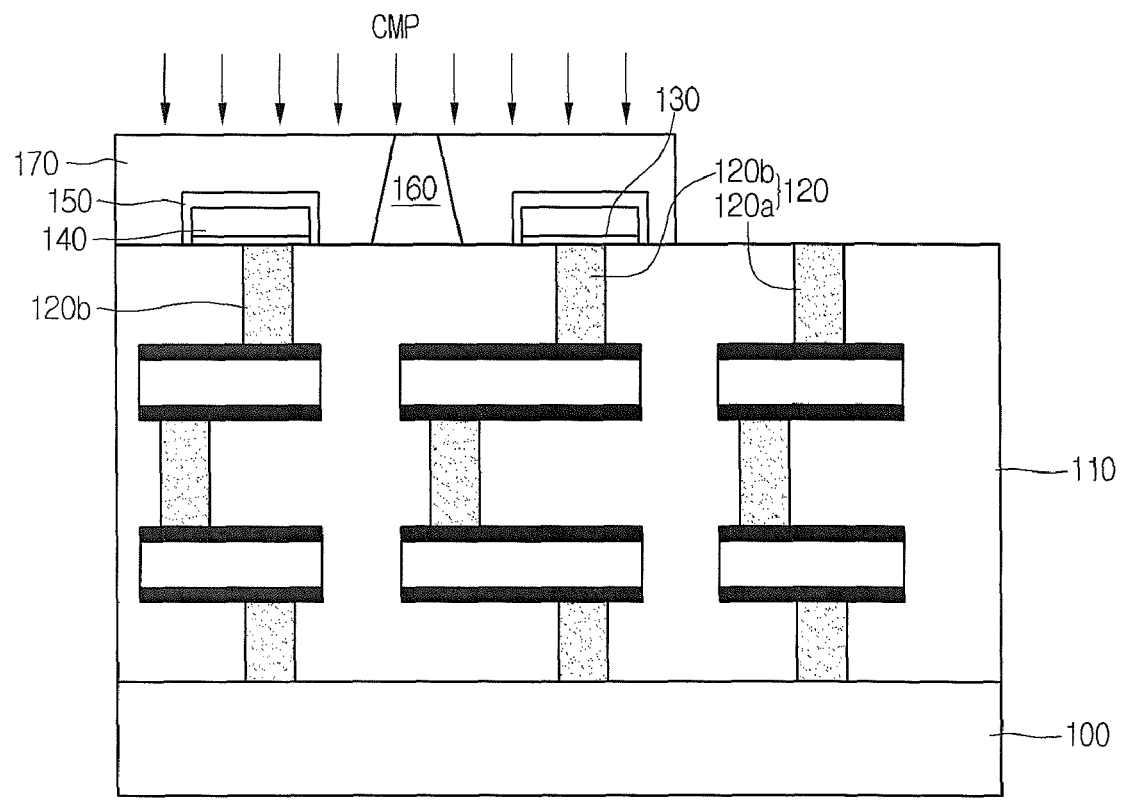

Referring to FIG. 5, the intrinsic layer 170 can be planarized to expose the isolating layer pattern 160 by a chemical mechanical polishing (CMP) process or the like. Upon performing the CMP process to expose the isolating layer pattern 160, the intrinsic layer 170 is separated between the isolating layer patterns 160. In some embodiments, the intrinsic layer 170 can be formed between the isolating layer patterns 160, exposing the isolating layer pattern 160 without planarizing the intrinsic layer 170.

Figure 6:
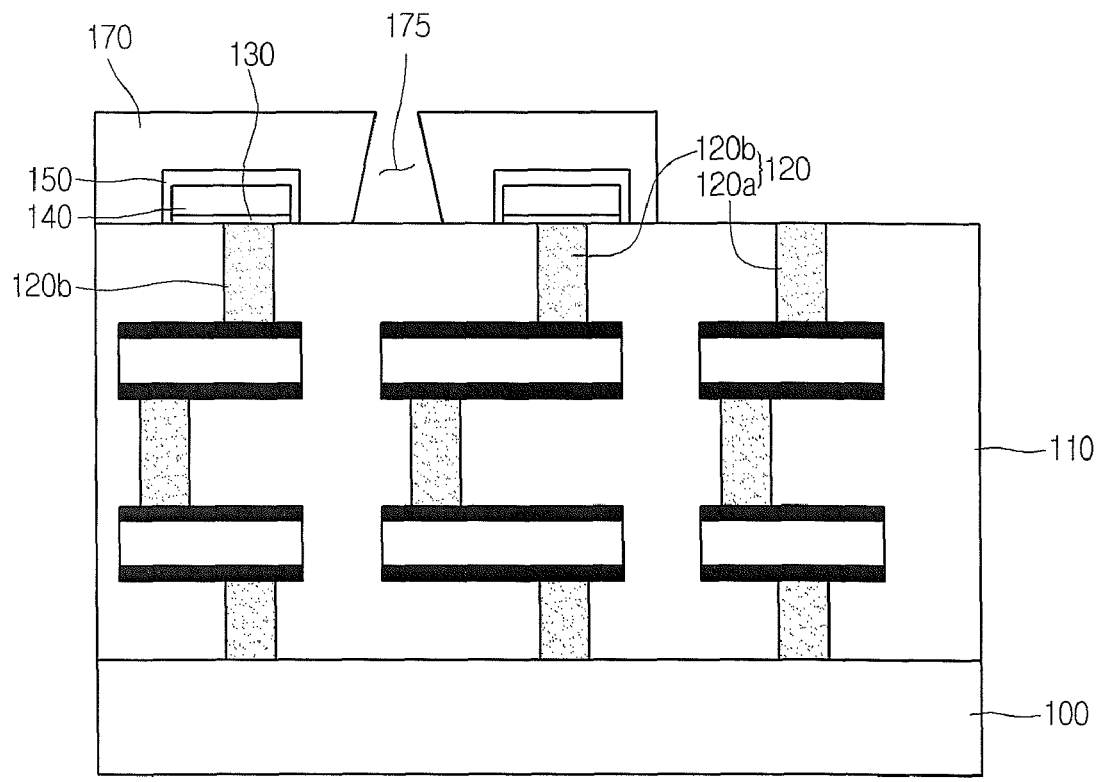

Referring to FIG. 6, the isolating layer pattern 160 can be removed to make a hole 175 separating the intrinsic layer 170 by unit pixel. Accordingly, the separated intrinsic layer 170 can be formed having a slope on its sidewall and separated by as space by removing the insulating layer pattern 160. In an embodiment where the isolating layer pattern 160 is photoresist, the isolating layer pattern 160 can be removed by ashing. In some embodiments, the removing process of the isolating layer pattern 160 can be omitted.

Figure 7:
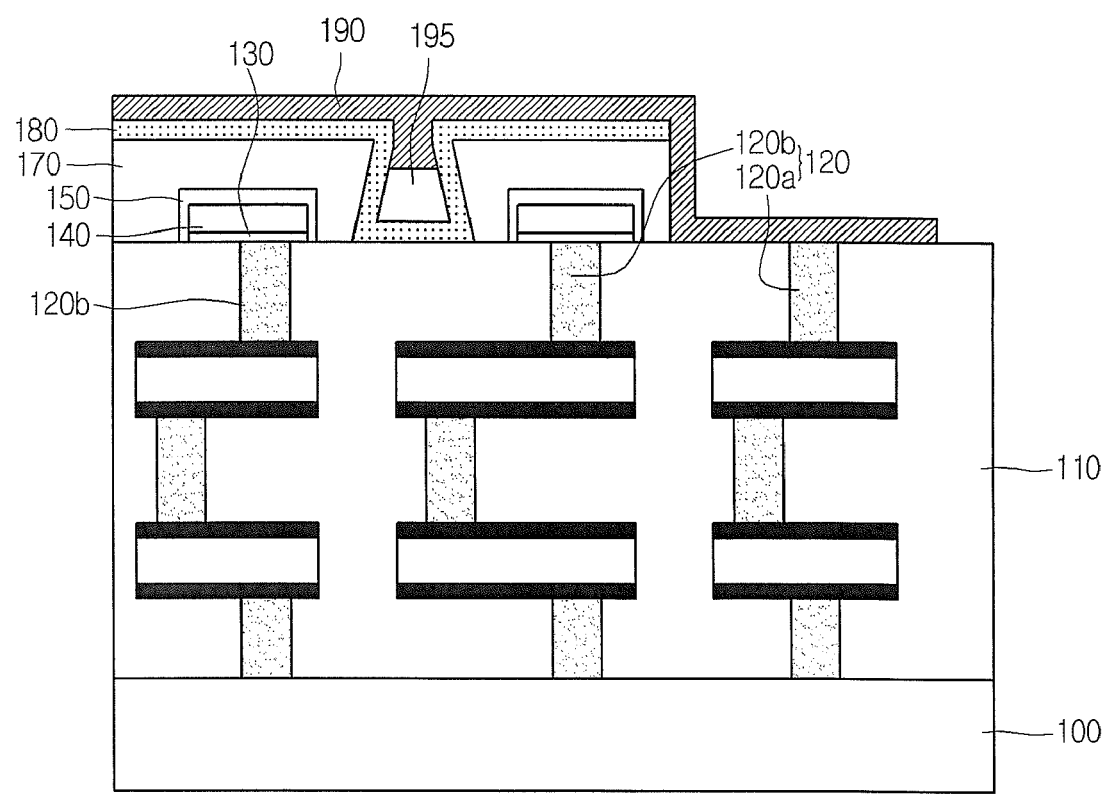

Referring to FIG. 7, a second conductive layer 180 can be formed on the separated intrinsic layers 170. The second conductive layer 180 can serve as a "P-type" layer of a PIN diode. In other words, the second conductive layer 180 can include, but is not limited to, a P-type conductive type conductive layer.

The second conductive layer 180 can be formed of, for example, p-type doped amorphous silicon. In an embodiment, the second conductive layer 180 can be formed by CVD, such as PECVD. For example, the second conductive layer 180 can be formed of p-type doped amorphous silicon through PECVD using a mixture of gas obtained by mixing boron with silane (SiH4) gas.

Next, an upper electrode 190 can be formed on the upper surface of the second conductive layer 180. The upper electrode 190 can be electrically connected to the exposed first plug 120a.

During forming the upper electrode 190, a void 195 may be formed between the second conductive type conduction layer 180 and the upper electrode 190. The isolation between unit pixels can be improved by the void 195. For example, the void can be formed by forming the upper electrode 190 with a material having low step coverage.

According to certain embodiments, the isolation between unit pixels can be improved by the void 195 formed between pixels boundaries.

The upper electrode 190 can be formed of a transparent electrode having good light transmission and conductivity. For example, the upper electrode 190 can be formed of indium tin oxide (ITO), cadmium tin oxide (CTO), or $ZnO_2$. A color filter layer and a microlens can additionally be provided.

In the image sensor according to embodiments of the present invention, the transistor circuitry and the photodiodes are vertically integrated. Therefore, the image sensor enables a fill factor to approach 100%, and furthermore can provide sensitivity higher than that of the related image sensor for the same pixel size.

Further, in comparison with the related image sensor, the image sensor according to embodiments of the present invention can further reduce process cost for the same resolution, and realize more complicated transistor circuitry in each unit pixel without reduction of the sensitivity.

Also, in the image sensor according to embodiments of the present invention, additional on-chip circuitry can be integrated to increase performance of the image sensor, and obtain miniaturization of the device as well as reduction of production cost.

Also, the image sensor according to embodiments of the present invention is capable of employing a vertical photodiode and can inhibit crosstalk by providing isolation between pixels.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, comprising:
    forming a circuit including an interconnection on a substrate;
    forming a lower electrode on the interconnection;
    forming separated intrinsic layers on the substrate including the lower electrode;
    forming a second conductive type conduction layer on the separated intrinsic layers; and
    forming an upper electrode on the second conductive type conduction layer,
    wherein forming the separated intrinsic layers comprises:
        forming an isolating layer pattern in regions between unit pixels;
        forming intrinsic layers between the isolating layer pattern; and
        removing the isolating layer pattern after forming the intrinsic layers.

2. The method according to claim 1, wherein the isolating layer pattern comprises a sloping sidewall.

3. The method according to claim 2, wherein the isolating layer pattern comprises a longer bottom surface than upper surface.

4. The method according to claim 1, wherein the isolating layer pattern comprises a photoresist pattern.

5. The method according to claim 1, wherein forming the intrinsic layers between the isolating layer pattern comprises forming intrinsic layer material between the isolating layer pattern while exposing a top surface of the isolating layer pattern.

6. The method according to claim 1, further comprising forming a barrier metal on the interconnection before forming the lower electrode.

7. The method according to claim 1, further comprising forming a first conductive type conduction layer on the lower electrode before forming the separated intrinsic layers.

8. The method according to claim 1, wherein the forming of the separated intrinsic layers comprises providing a sloping sidewall to the separated intrinsic layers.

9. A method for manufacturing an image sensor, comprising:
　　forming a circuit including an interconnection on a substrate;
　　forming a lower electrode on the interconnection;
　　forming separated intrinsic layers on the substrate including the lower electrode;
　　forming a second conductive type conduction layer on the separated intrinsic layers; and
　　forming an upper electrode on the second conductive type conduction layer,
　　wherein forming the separated intrinsic layers comprises:
　　　　forming an isolating layer pattern in regions between unit pixels; and
　　　　forming intrinsic layers between the isolating layer pattern, wherein the forming of the intrinsic layers between the isolating layer pattern comprises:
　　　　　　forming an intrinsic layer material on and between the isolating layer pattern; and
　　　　　　planarizing the intrinsic layer material to expose the isolating layer pattern.

10. A method for manufacturing an image sensor, comprising:
　　forming a circuit including an interconnection on a substrate;
　　forming a lower electrode on the interconnection;
　　forming separated intrinsic layers on the substrate including the lower electrode;
　　forming a second conductive type conduction layer on the separated intrinsic layers;
　　forming an upper electrode on the second conductive type conduction layer; and
　　forming a void between the second conductive type conduction layer and the upper electrode during the forming of the upper electrode on the second conductive layer.

11. The method according to claim 10, wherein the void is formed between pixel boundaries.

* * * * *